United States Patent [19]

Poorman et al.

[11] Patent Number: 5,380,415
[45] Date of Patent: Jan. 10, 1995

[54] VACUUM VAPOR DEPOSITION

[75] Inventors: Richard M. Poorman, Arab; Jack L. Weeks, Scottsboro, both of Ala.

[73] Assignee: The United States of America as represented by the Administrator of the National Aeronautics and Space Administration, Washington, D.C.

[21] Appl. No.: 191,309

[22] Filed: Feb. 3, 1994

[51] Int. Cl.6 ............................................. C23C 14/00
[52] U.S. Cl. ................... 204/192.38; 427/580; 118/723 VE; 204/298.41
[58] Field of Search ............ 118/723 VE; 204/298.41, 204/192.38; 427/580

[56] References Cited

U.S. PATENT DOCUMENTS 5,103,766  4/1992  Yoshikawa .................. 118/723 VE
5,221,349  6/1993  Tamagaki .................... 118/723 VE Primary Examiner—Richard Bueker
Attorney, Agent, or Firm—Robert L. Broad, Jr.; Guy M. Miller; Alan J. Kennedy

[57] ABSTRACT

A method and apparatus for vapor deposition of a thin metallic film utilizing an ionized gas arc directed onto a source material spaced from a substrate to be coated in a substantial vacuum while providing a pressure differential between the source and the substrate so that as a portion of the source is vaporized the vapors are carried to the substrate. The apparatus includes a modified tungsten arc welding torch having a hollow electrode through which a gas, preferably inert, flows and an arc is struck between the electrode and the source. The torch, source and substrate are confined within a chamber within which a vacuum is draw. When the arc is struck, a portion of the source is vaporized and the vapors flow rapidly toward the substrate. A reflecting shield is positioned about the torch above the electrode and the source to ensure that the arc is struck between the electrode and the source at startup. The electrode and the source may be confined within a vapor guide housing having a duct opening toward the substrate for directing the vapors onto the substrate.

20 Claims, 2 Drawing Sheets

VACUUM VAPOR DEPOSITION

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 U.S.C. 2457).

BACKGROUND OF THE INVENTION (1) Field of the Invention

This invention relates to the deposition of thin films of metal on substrates, and more particularly to the vapor deposition of a thin metallic film utilizing an ionized gas arc directed onto a target material spaced from a substrate to be coated in a substantial vacuum while providing a pressure differential between the target and the substrate so that as a portion of the target is vaporized the vapors are carried to the substrate.

(2) Description of Related Art

Vapor deposition for coating a thin film of material on a substrate is known in the art and applications of this process have increased dramatically over the past few years. Applications for such coatings have grown substantially and this includes the electronics industry. Electronic requirements for different resistivity vary from zero for superconductors to infinity for transistor separation. Wide variations in value for thermal conductivity has also resulted in various applications. Other important properties which can be affected by such coating include reflectivy and/or transmission of different wavelengths of energy, corrosion resistance, stability, absorption, hardness, and bond strength. Other applications for vapor deposited coatings are being developed rapidly.

Although there are many processes that are utilized for vapor deposition, each process has inherent characteristics that are advantageous for certain particular applications including the coating of irregular shaped bodies. Some of the vapor deposition processes commonly used today include plasma-activated chemical vapor deposition, laser chemical vapor deposition, sputtering, cathode-spot arc coating, electron beam evaporation deposition, ion plating, arc evaporation and cathode arc plasma deposition. However, all of the known processes tend to have relatively slow deposition rates compared to non-vapor coating methods. Most vapor deposition processes are driven by vapor pressure differentials toward the surface being coated. Lower pressure of other gases in the system tends to increase the mass flow of the coating vapors and results in fewer obstructions of the vapor flow to the surface being coated. Electromagnetic and electrostatic fields are often used to direct the vapor flow and to improve or select the desired particle size utilized in producing the coating.

Many metal joining processes for fabrication, joining sub-assemblies, maintenance and repair in space have been considered by the National Aeronautics and Space Administration. One of these processes utilizes a modified gas tungsten arc welding (GTAW) process including a hollow welding electrode wherein an inert gas is fed through the hollow electrode so as to weld in a space vacuum environment. An arc may be thus established between the electrode and the workpiece as a result of the ionized gas at the electrode so that a GTAW type weld can be made in a vacuum. During this work, vapor deposits were observed.

SUMMARY OF THE INVENTION

Consequently, it is a primary object of the present invention to provide a method and apparatus for producing vapor deposits utilizing the arc formed in a gas flowing through a hollow electrode in a substantially vacuum environment.

It is another object of the present invention to provide a vapor deposition process with a higher deposition rate than heretofore possible by utilizing a hollow tungsten electrode through which an inert gas flows so that an arc can be struck between the electrode and a source under vacuum conditions such that large pressure differentials result which effect a flow of vaporized material from the heated source toward a surface to be coated.

It is a further object of the present invention to provide a method and apparatus for effecting vapor deposition of a coating in a vacuum chamber by directing an inert gas through a hollow tungsten electrode to effect an arc between the electrode and a target of the desired coating material under conditions such that a pressure gradient is created resulting in the flow of vaporized target material onto the surface of a substrate spaced from the target.

It is a still further object of the present invention to provide a method and apparatus for effecting vapor deposition of a coating in a vacuum chamber by directing an inert gas through a hollow tungsten electrode to effect an arc between the electrode and a target of the desired coating material under conditions such that a pressure gradient is created which results in the flow of vaporized target material onto the surface of a substrate spaced from the target, the vapor being guided from the target to the substrate, and the apparatus including a shield to ensure that the arc is struck between the electrode and the target during start-up.

Accordingly, the present invention provides a method and apparatus for depositing thin films of metal onto the surface of the substrate utilizing a hollow tungsten electrode of a modified tungsten arc welding torch through which an inert gas flows so that an arc may be struck between the electrode and a target or source of the metal to be deposited onto the substrate, the apparatus being disposed in the environment of a substantial vacuum. When the arc is struck, a portion of the target is vaporized and this vapor, because the higher pressure in the vicinity of the target due to the increased gas results in a pressure gradient between the target and the substrate, quickly flows toward the substrate. In order to ensure that the arc is struck between the electrode and the target at start-up, an insulating shield or electrostatic isolation reflector is disposed about the torch above the electrode. The target may be disposed within a confining housing having a duct opening toward the substrate, the duct thereby forming a vapor guide so that the vapor may be directed accurately and positively toward the surface of the substrate.

BRIEF DESCRIPTION OF THE DRAWINGS

The particular features and advantages of the invention as well as other objects will become apparent from the following description taken in connection with the accompanying drawings in which.

DESCRIPTION OF THE PREFERRED EMBODIMENT

Figure 1:
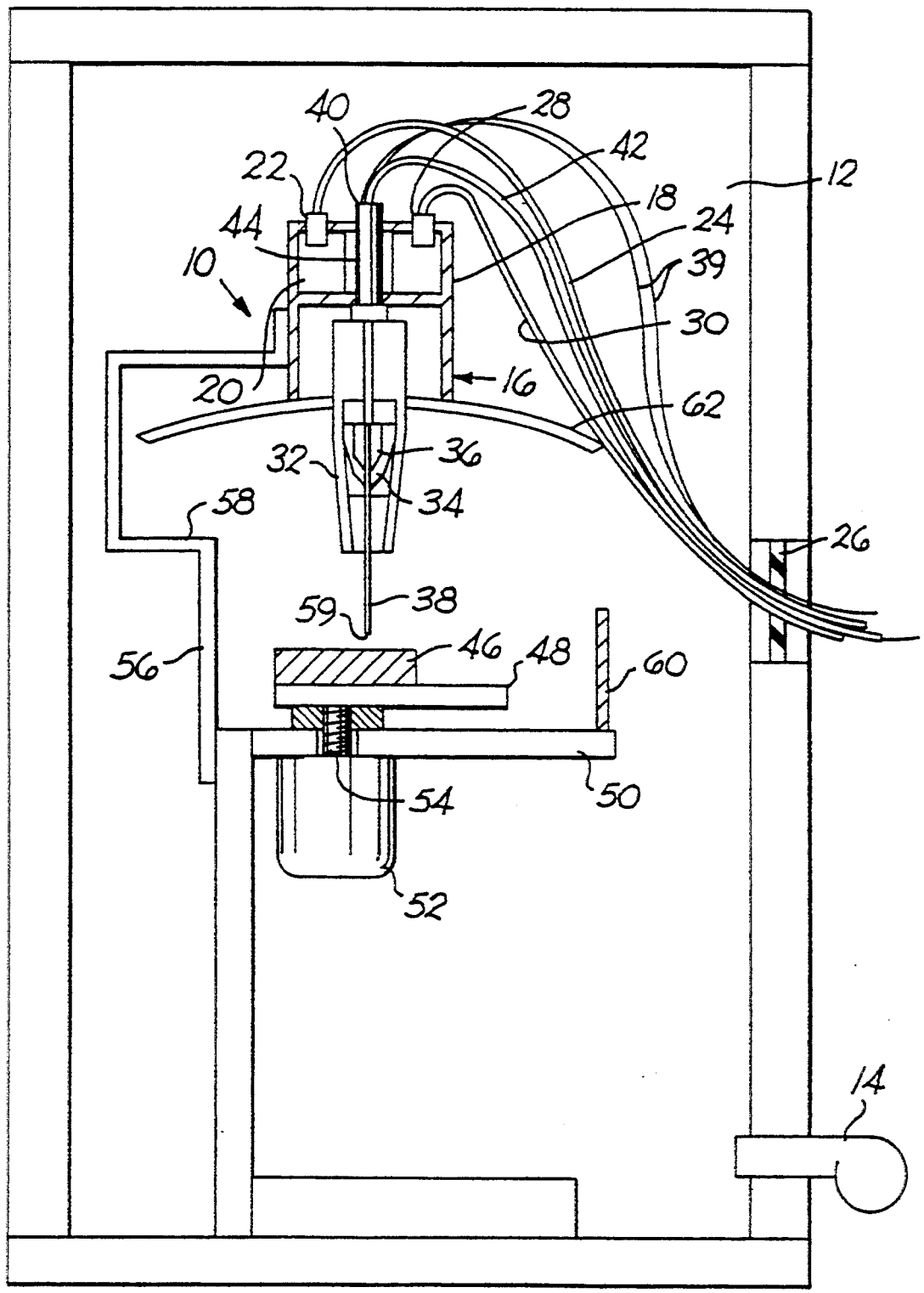
FIG. 1 is a diagrammatic view of the preferred embodiment of apparatus constructed in accordance with the principles of the present invention.

Referring now to the drawings, apparatus constructed in accordance with the present invention includes a modified gas tungsten arc welding torch 10 mounted within a closed substantially sealed chamber 12 which communicates with a vacuum pump 14, such as a turbomolecular pump, for drawing the pressure within the chamber down to a substantial vacuum in the range of 1 to 10 micron. The torch 10 comprises a torch body 16 including a head 18 having a cooling chamber 20, the body being similar in construction to that disclosed in Poorman et al U.S. Pat. No. 5,149,932. Coolant such as water is fed to the chamber 20 through an inlet 22 from a conduit 24 from outside the vacuum chamber 12 through an airtight sealed entry 26 and exits from the cooling chamber 20 from an outlet 28 through a return conduit 30, exiting the vacuum chamber through the entry 26.

Secured within the body 16 of the torch is a cup 32 formed from electrical insulator material which carries a hollow collet body 34, the body 34 carrying a hollow collet 36. Secured within the hollow of the collet 36 is the cathode electrode 38 of the welding torch, the electrode being in the form of an elongated hollow tube which is supplied with electrical power by electrical leads 39 directed through an inlet 40 in the head 18, the current supplied to the electrode being in the range of 30 to 150 amps. with 100 amps. being common. Also communicating with the inlet 40 is an inert gas conduit 42 which extends into the vacuum chamber from the exterior thereof through the sealed entry 26. The gas, which is preferably any conventional inert gas used in GTAW welding such as argon, flows through a tube 44 within the head 18 and down through the hollow bore 45, illustrated in FIG. 2, of the electrode 38 onto a target 46 of the metallic or other electrically conductive is material which is to form the coating.

The target 46 may be supported on a base 48 positionable relative to a table 50, the base 48 preferably being positionable vertically relative to the table by motor drive means 52 which may include a lead screw 54 or the like to position the target 46 relative to the electrode 38. A bracket 56 which is secured to the table 50 is in turn secured to a torch bracket 58 for fixedly positioning the torch 10 relative to the table. Thus, the spacing between the end or tip 59 of the electrode 38 and the target may be selectively varied in the range of 1 millimeter to 20 millimeters by moving the base 48 vertically relative to the tip of the electrode. The substrate 60 or body to be coated is also carried on the table 50 spaced laterally from the target 46. The substrate 60 may be glass or a ceramic material, or may be any material which is desired to be coated by a thin film of the target material.

When an arc is struck between the tip 59 of the electrode 38 and the target 46, the inert shielding gas flowing from the electrode results in a significantly higher pressure in the vicinity of the target than at the surface of the substrate 60. Thus, as a portion of the target is vaporized by the heat of the arc, the metal vapor is very quickly carried outwardly toward the surface of the substrate. The flow rate of the gas within the electrode is in the range of 0.1 cubic centimeters per second to 10 cubic centimeters per second measured at standard conditions, i.e., at one atmosphere and 20° C. This results in a typical gas pressure of approximately 500 micron at the molten surface of the target thereby resulting in a large pressure gradient between the target and the substrate. The gas velocity under these conditions is approximately sonic velocity and the gas rapidly carries the metal vapors to the substrate.

In order to ensure that the arc at start-up is struck between the cathode electrode 38 and the target 46 rather than between the electrode and some other portion of the apparatus above the electrode, an insulating shield or reflector 62, which acts as an electrostatic isolation device, is secured about the cup 32. The shield 62 may be any non-conductor of electricity such as pyrex glass and may be of an arcuate configuration such as a sector of a sphere having a concave surface facing toward the target 46 as illustrated, and may be in the order of 50 millimeters to 100 millimeters in circumference to ensure that the arc at start-up is reflected toward the target.

Figure 2:
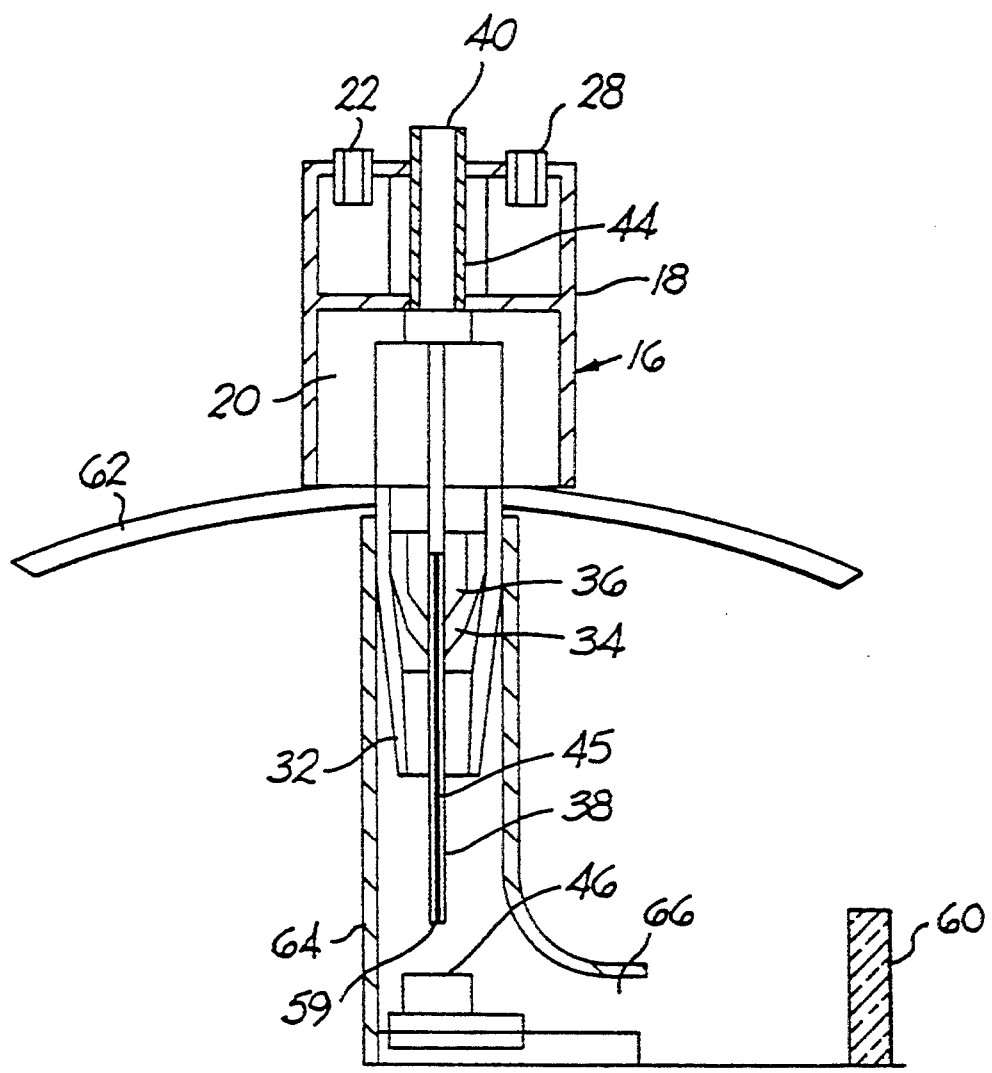
FIG. 2 is a diagrammatic view of the preferred form of the torch and a vapor guide which preferably is used with the apparatus.

With the process of the invention, very thin films of metal may be coated onto the surface of a substrate 60 of any configuration. In order to ensure that the vapors are directed onto the substrate rather than onto the surface of the walls of the chamber 12, the electrode 38 and the target 46 may be confined within a hollow vapor guide housing 64 fastened about the cup 32 as illustrated in FIG. 2. The housing 64 includes a conduit or duct 66 which communicates with the interior of the housing and is spaced laterally between the target 46 and the substrate 60 so that the metal vapors released from the target are directed positively to the substrate. This provides a more efficient transfer of the vapors onto the substrate.

The process of the present invention shows a higher vapor deposition rate than processes of the prior art by combining a low chamber operating pressure with a strong pressure differential within the vacuum chamber, and high energies in the melt zone of the target. The pressure differentials result in a flow of gas precisely from the heated source or target material toward the intended surface of the substrate to be coated. The flow of inert gas helps to carry the vapor to the surface of the substrate and as the gas flows outwardly, its pressure rapidly drops as it is expanded into the surrounding inert vacuum. The inertia of the vapor impinges upon and coats the substrate such that many characteristic advantages of the prior art are combined into the vapor deposition process of the present invention. For example, the process combines high vapor pressure differentials (high coating rates), directional impetus of the gas flow, a low absolute pressure at the surface being coated and a high purity environment. These conditions are very desirable for most vapor deposition applications and the combination thereof is not available in any of the known prior art. Additionally, the process may support multiple arcs that vaporize more than one material so that alloys or alternating layers of material may be coated onto a substrate.

Numerous alterations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having thus set forth the nature of the invention, what is claimed herein is:

1. Apparatus for coating a thin metal film by depositing vapors from a source of the metal onto a substrate spaced from said source, said apparatus comprising an enclosed substantially sealed chamber, a gas tungsten arc welding torch including a torch body mounted within said chamber, an elongated hollow tungsten electrode carried within and electrically insulated from said body, said electrode having a tip disposed externally of said body, an elongated bore extending through said electrode from within said body and opening at said tip, means for supplying a gas to said torch communicating with said bore so that said gas flows out said tip, means for supplying electrical power to said electrode, support means for mounting said source spaced from said tip of said electrode for forming an electrical arc between said tip and said source and for impingement of said gas from said tip upon said source to vaporize a portion of said source, substrate mounting means for mounting said substrate spaced from said electrode and said source for receiving vapors from said source, a shield of electrically non-conductive material disposed about said torch spaced from said tip for reflecting and precluding an arc from forming between said tip and said torch when electrical power is initially supplied to said electrode to form an arc, and means for reducing the pressure within said chamber to a substantial vacuum.

2. Apparatus as recited in claim 1, wherein said shield has an arcuate configuration.

3. Apparatus as recited in claim 2, wherein said shield has a concave surface facing toward said source.

4. Apparatus as recited in claim 1, wherein said source is disposed within a vapor guide housing, said guide housing having a duct communicating with the interior of said guide housing, said duct including a mouth through which said gas and vapors may egress, and said mouth being disposed for directing said gas and vapors onto said substrate.

5. Apparatus as recited in claim 4, wherein the tip of said electrode and said source are disposed within said guide housing.

6. Apparatus as recited in claim 4, wherein said shield has an arcuate configuration.

7. Apparatus as recited in claim 6, wherein said shield has a concave surface facing toward said source.

8. Apparatus as recited in claim 7, wherein the tip of said electrode and said source are disposed within said guide housing.

9. A method of coating a thin film of metal released from a source of said metal onto the surface of a substrate, said method comprising: mounting said source and said substrate in spaced apart disposition within an enclosed chamber, positioning a welding torch having a hollow electrode with a tip at a free end thereof within said chamber with said tip disposed adjacent said source, applying a gas through the hollow of said electrode directed onto said source, applying electrical power to said electrode to form an arc between the tip of the electrode and said source to vaporize a portion of said source, reducing the pressure within said chamber to sub-atmospheric pressure such that the pressure at said substrate is less than the pressure at the source and vapors released from said source flow onto said substrate.

10. In the method as recited in claim 9, wherein the flow rate of said gas through said electrode is of a magnitude to create a gas pressure at said source which is substantially greater than the pressure at said substrate, thereby resulting in a large pressure gradient between the source and the substrate.

11. In the method as recited in claim 10, wherein the velocity of the gas leaving the source is substantially sonic velocity.

12. In the method as recited in claim 10, wherein the pressure within said chamber is in the range of one to ten micron and the pressure of said gas at the surface of the source is approximately 500 micron.

13. In the method as recited in claim 10, wherein the spacing between said tip and said source is in the range of one to twenty millimeters.

14. In the method as recited in claim 13, wherein the pressure within said chamber is in the range of one to ten micron and the pressure of said gas at the surface of the source is approximately 500 micron.

15. In the method as recited in claim 14, wherein the velocity of the gas leaving the source is substantially sonic velocity.

16. In the method as recited in claim 9, including reflecting said arc upon start-up from a reflective shield constructed from electrically non-conductive material disposed about said torch spaced from said tip and said source onto said substrate.

17. In the method as recited in claim 9, including directing said gas and said vapors through a vapor guide housing onto said substrate.

18. In the method as recited in claim 16, wherein the flow rate of said gas through said electrode is of a magnitude to create a gas pressure at said source which is substantially greater than the pressure at said substrate, thereby resulting in a large pressure gradient between the source and the substrate.

19. In the method as recited in claim 17, wherein the flow rate of said gas through said electrode is of a magnitude to create a gas pressure at said source which is substantially greater than the pressure at said substrate, thereby resulting in a large pressure gradient between the source and the substrate.

20. In the method as recited in claim 19, wherein the pressure within said chamber is in the range of one to ten micron and the pressure of said gas at the surface of the source is approximately 500 micron.

* * * * *